(12) United States Patent
Park et al.

(10) Patent No.: US 8,338,921 B2
(45) Date of Patent: Dec. 25, 2012

(54) WAFER LEVEL CHIP SCALE PACKAGE HAVING AN ENHANCED HEAT EXCHANGE EFFICIENCY WITH AN EMF SHIELD AND A METHOD FOR FABRICATING THE SAME

(75) Inventors: Chang Jun Park, Gyeonggi-do (KR); Kwon Whan Han, Seoul (KR); Seong Cheol Kim, Seoul (KR); Sung Min Kim, Seoul (KR); Hyeong Seok Choi, Seoul (KR); Ha Na Lee, Gyeonggi-do (KR); Tac Keun Oh, Gyeonggi-do (KR); Sang Joon Lim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/289,365

(22) Filed: Nov. 4, 2011

(65) Prior Publication Data
US 2012/0049385 A1 Mar. 1, 2012

Related U.S. Application Data

(62) Division of application No. 12/347,020, filed on Dec. 31, 2008, now abandoned.

(30) Foreign Application Priority Data

Jan. 22, 2008 (KR) .................. 10-2008-0006605
Apr. 25, 2008 (KR) .................. 10-2008-0038846
May 7, 2008 (KR) .................. 10-2008-0042257

(51) Int. Cl.
*H01L 23/48* (2006.01)
*H01L 21/28* (2006.01)

(52) U.S. Cl. ........ 257/659; 257/621; 257/660; 257/774; 257/E23.011; 257/E23.114; 257/E23.174; 438/667

(58) Field of Classification Search .................. 257/621, 257/774, E23.174, 659, 660, E23.011, E23.114; 438/667
See application file for complete search history.

(56) References Cited

U.S. PATENT DOCUMENTS
2002/0100960 A1  8/2002 Chang et al.
(Continued)

FOREIGN PATENT DOCUMENTS
JP  2007-067216 A  3/2007
(Continued)

OTHER PUBLICATIONS

USPTO RR mailed May 12, 2011 in connection with U.S. Appl. No. 12/347,020.
(Continued)

*Primary Examiner* — Peniel M Gumedzoe
(74) *Attorney, Agent, or Firm* — Ladas & Parry LLP

(57) ABSTRACT

A wafer level chip scale package having an enhanced heat exchange efficiency with an EMF shield is presented. The wafer level chip scale package includes a semiconductor chip, an insulation layer, and a metal plate. The semiconductor chip has a plurality of bonding pads on an upper face thereof. The insulation layer is disposed over the upper face of the semiconductor chip and has openings that expose some portions of the bonding pads. The metal plate covers an upper face of the insulation layer and side faces of the semiconductor chip in which the metal plate is electrically insulated from the bonding pads.

3 Claims, 16 Drawing Sheets

U.S. PATENT DOCUMENTS

| | | |
|---|---|---|
| 2002/0189834 A1 | 12/2002 | Goetschalckx |
| 2003/0094683 A1* | 5/2003 | Poo et al. ..................... 257/686 |
| 2005/0046002 A1* | 3/2005 | Lee et al. ..................... 257/678 |
| 2007/0062637 A1 | 3/2007 | Sjoedin |
| 2007/0262441 A1 | 11/2007 | Chen |
| 2008/0265421 A1 | 10/2008 | Brunnbauer et al. |

FOREIGN PATENT DOCUMENTS

| | | |
|---|---|---|
| JP | 2008-010496 A | 1/2008 |
| JP | 2008-288686 A | 11/2008 |
| KR | 1020010000763 A | 1/2001 |
| KR | 1020010048002 A | 6/2001 |
| KR | 100728978 B1 | 6/2007 |
| KR | 1020070077686 A | 7/2007 |

OTHER PUBLICATIONS

USPTO NFOA mailed Aug. 4, 2011 in connection with U.S. Appl. No. 12/347,020.

* cited by examiner

WAFER LEVEL CHIP SCALE PACKAGE HAVING AN ENHANCED HEAT EXCHANGE EFFICIENCY WITH AN EMF SHIELD AND A METHOD FOR FABRICATING THE SAME

CROSS-REFERENCE TO RELATED APPLICATIONS

The present application claims priority to Korean patent application number 10-2008-0006605 filed on Jan. 22, 2008, Korean patent application number 10-2008-0038846 filed on Apr. 25, 2008, and Korean patent application number 10-2008-0042257 filed on May 7, 2008, which are incorporated herein by reference in their entireties.

BACKGROUND OF THE INVENTION

The present invention relates to a wafer level chip scale package and a method for fabricating the same, more particularly to a wafer level chip scale package having an enhanced heat radiation efficiency which is also capable of shielding electromagnetic radiation emitted form a semiconductor chip.

SUMMARY OF THE INVENTION

Embodiments of the present invention are directed to a wafer level chip scale package which is able to enhance heat radiation efficiency and shield electromagnetic wave emitted from a semiconductor chip, and a method for fabricating the same.

Also, embodiments of the present invention are directed to a wafer level chip scale package which is able to simplify the fabrication process and minimize degradation in the resultant electric properties, and a method for fabricating the same.

In one embodiment, a wafer level chip scale package comprises a semiconductor chip having a plurality of bonding pads on an upper face thereof; an insulation layer disposed over the upper face of the semiconductor chip and having openings that expose some portions of the bonding pads; a metal plate covering an upper face of the insulation layer and side faces of the semiconductor chip and electrically insulated away from the bonding pads.

The metal plate is formed over some portions of the side faces of the semiconductor chip.

The wafer level chip scale package may further comprise a metal seed layer interposed below the metal layer.

In another embodiment, a method for fabricating a wafer level chip scale package comprises forming a blind groove in a scribe lane of a wafer by carrying out a first sawing process on the wafer along the scribe lane, wherein the wafer is divided by the scribe lane and has semiconductor chips formed with bonding pads exposed by openings formed in an insulation layer formed over an upper face of the semiconductor chip; forming a metal plate over the insulation layer, wherein the metal plate fills the blind groove and is insulated away from the bonding pads; and separating the semiconductor chips from the wafer by carrying out a second sawing process along the scribe lane.

The first sawing process is carried out using a first blade which has the same width as the scribe lane, and the second sawing process is carried out using a second blade having narrower width than the scribe lane.

In yet another embodiment, a wafer level chip scale package comprises a semiconductor chip having a plurality of ground bonding pads and signal bonding pads over an upper face thereof; a first insulation layer disposed over the upper face of the semiconductor chip which has openings that expose some portions of the ground bonding pads and the signal bonding pads; a first metal plate insulated with the signal bonding pads and covering the first insulation layer and side faces of the semiconductor chip; and a second metal plate disposed under a lower face of the semiconductor chip.

The first metal plate formed at the side face of the semiconductor chip has the same height as the height of the side face.

The first and second metal plates are made of one of copper (Cu) or copper alloy.

The wafer level chip scale package may further comprise a second insulation layer formed between the lower face of the semiconductor chip and the second metal plate.

Some of the first metal is formed in an island shape over an upper face of the signal bonding pad.

In still yet another embodiment, a method for fabricating a wafer level chip scale package is presented which comprises forming a blind groove having a certain depth in a scribe lane of a wafer by carrying out a first sawing process on the wafer along the scribe lane, wherein the wafer is divided by the scribe lane and has semiconductor chips formed with a plurality of ground bonding pads and signal bonding pads exposed by openings formed in a first insulation layer formed over an upper face of the semiconductor chip; forming a first metal plate over the insulation layer, wherein the first metal plate is insulated with the signal bonding pads and electrically connected with the ground bonding pads; polishing a lower face of the wafer to expose the first metal plate filled in the blind groove; forming a second metal plate connected with the first metal plate exposed to the lower face of the wafer; and separating a plurality of chip level packages from the wafer by carrying out a second sawing process on the wafer along the scribe lane.

The first and second metal plates are formed by plating process and the first and second metal plates are made preferably made of copper (Cu) or a copper alloy.

The first sawing process is carried out using a first blade which has substantially the same width as the scribe lane, and the second sawing process is carried out using a second blade having narrower width than the scribe lane.

The step of forming the first metal plate includes forming a first metal seed layer over the bonding pads and the first insulation layer including the surface of the blind groove; forming a mask pattern over the first metal seed layer in the vicinity of the signal bonding pad; forming the first metal plate over the exposed mask pattern; and removing the mask pattern and the first metal seed layer therebelow.

In still yet another embodiment, a wafer level chip scale package is presented that comprises a semiconductor chip having a circuit unit and bonding pads electrically connected to the circuit unit; through electrodes passing through an upper face of the semiconductor chip and through a lower face of the semiconductor opposite to the upper face; redistribution units disposed over the upper face of the semiconductor chip and provided with a first end portion formed integrally with the through electrode and a second end portion opposite to the first end portion and electrically connected to respective corresponding bonding pads; and a dummy conductive pattern disposed over the upper face of the semiconductor chip and electrically insulated away from the redistribution units.

The wafer level chip scale package may further comprise a dummy metal seed pattern interposed between the dummy conductive pattern and the upper face of the semiconductor chip.

The redistribution and the dummy conductive pattern have substantially the same thickness.

In yet another embodiment, a method for fabricating a wafer level chip scale package comprises forming through holes passing through an upper face of a semiconductor chip and through a lower face opposite to the upper face, wherein the upper surface of the semiconductor chip is formed with bonding pads electrically connected to a circuit unit; forming a metal seed layer over an inner surface of the semiconductor chip formed by the through holes and the upper face of the semiconductor chip; forming mask patterns having a band shape over the metal seed layer along a periphery of the redistribution regions respectively connecting the through hole and the bonding pad corresponding to the through hole; forming a through electrode inside of the through hole exposed by the mask pattern, forming a redistribution unit within each redistribution region and forming a dummy conductive pattern in an outside of each mask pattern; removing the mask patterns from the metal seed layer; and removing the metal seed layer formed at a position corresponding to the mask pattern from the upper face of the semiconductor chip.

The step of forming the mask patterns over the metal seed layer may includes forming a photoresist film over the metal seed layer; and patterning the photoresist film by exposing and developing the photoresist film.

Alternatively, the step of forming the mask patterns over the metal seed layer may include providing flowable mask material over the metal seed layer in shape of a band; and curing the flowable mask material.

DESCRIPTION OF SPECIFIC EMBODIMENTS

Figure 1:
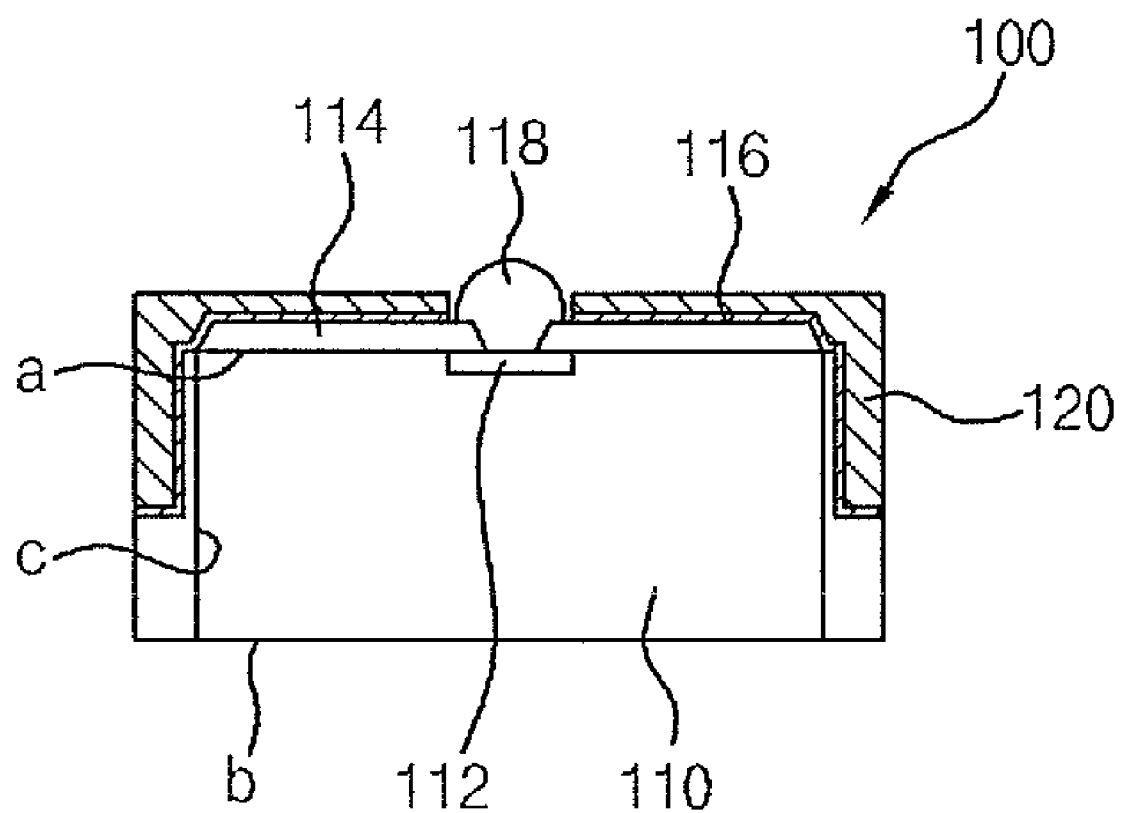
FIG. 1 is a cross-sectional view illustrating a wafer level chip scale package in accordance with an embodiment of the present invention.

FIG. 1 is a cross-sectional view illustrating a wafer level chip scale package in accordance with an embodiment of the present invention.

Referring to FIG. 1, a wafer level semiconductor package 100 of the present invention is shown to include a semiconductor chip 110, an insulation layer 114, bonding pads 112 and a metal plate 120. In addition, the wafer level semiconductor level semiconductor package 100 may further include an external connection terminal 118.

The semiconductor chip 110 may also, for example, have a rectangular parallelepiped shape. The semiconductor chip 110 includes an upper face a, a lower face b which is opposite to the upper face a and side faces which connect the upper face a and the lower face b.

The bonding pads 112 are disposed over the upper face a of the semiconductor chip 110. Each bonding pad 112 may be disposed, for example, at a middle of the upper face a of the semiconductor chip 110. Alternatively, each bonding pad 112 may be disposed at an edge of the upper face a of the semiconductor chip 110.

The insulation layer 114 is may be disposed over the upper a face of the semiconductor chip 110 and the insulation layer 114 has an opening that exposes the bonding pad 112.

The wafer level package 100 in accordance with the present embodiment may further include a redistribution unit (not shown). The redistribution unit may be disposed over the insulation layer 114 and may have a linear shape when viewed from the above. The redistribution unit is electrically connected with the bonding pad 112.

The external connection terminal 118 may be directly connected with the bonding pad 112 or indirectly connected with the bonding pad by the redistribution unit (not shown) which is electrically connected with the bonding pad 112.

The metal plate 120 is shown to cover the upper a face and the side c faces of the semiconductor chip 110. The metal plate 120 is preferably electrically insulated from the bonding pad 112 formed on the upper a face of the semiconductor chip 110 and the external connection terminal 118.

The metal plate 120 may preferably include copper (Cu) or copper alloy containing copper (Cu) having superior thermal conductivity and heat radiating properties.

Between the insulation layer 114 and the metal plate 120, for example, a metal seed layer 116 may be interposed.

In the present embodiment, the metal plate 120 may be disposed over the upper a face and the side c faces of the semiconductor chip 110 is, for example, as being disposed and formed integrally.

The metal plate 120 disposed over the side c face of the semiconductor chip 110 may have a length shorter than a thickness of the side c face of the semiconductor chip 110. Alternatively, the metal plate 120 may cover the entire side c face of the semiconductor chip 110.

Hereinafter, a method for fabricating the wafer level chip scale package will be described in detail with reference to FIGS. 2A through 2E.

Figure 2A:
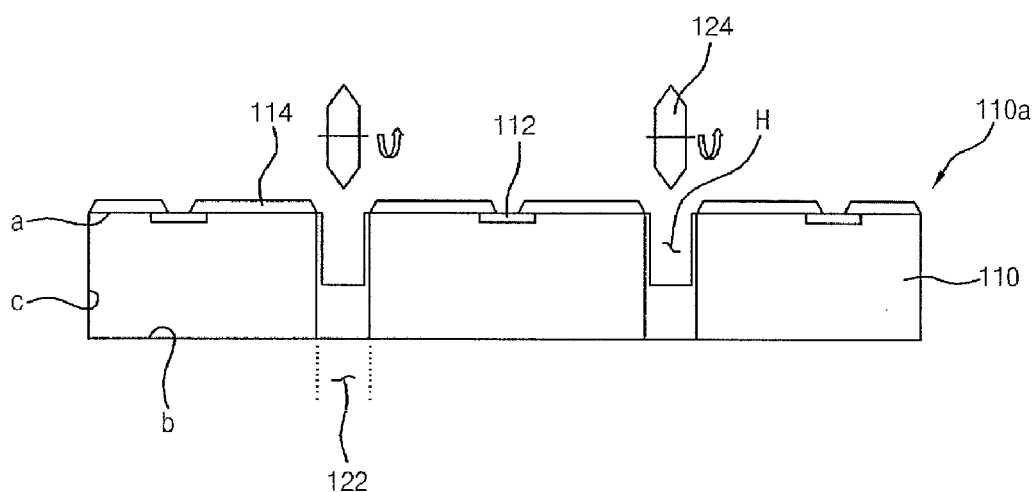
FIGS. 2A through 2E are cross-sectional views illustrating the steps of a method for fabricating the wafer level chip scale package shown in FIG. 1.

Referring to FIG. 2A, the semiconductor chips 110 formed with a plurality of the bonding pads 112 are formed over wafer the upper a face of the semiconductor chip fabrication process. Scribe lanes 122 are formed into the semiconductor chips 110 and through the insulation layers 114, respectively. The scribe lanes 122 make opening for exposing the bonding pad 112 over the upper a face of the semiconductor chips 110.

After the semiconductor chip 110 is formed over the wafer 110a, a first sawing process is carried out along the scribe lane 122.

The first sawing process is carried out by a first blade 124 having substantially the same width as the scribe lane 122, and a blind groove H is formed along the scribe lane 122 as a result of the first sawing process. In the present embodiment, the blind groove H has a depth less than a thickness of the wafer 110a.

Figure 2B:
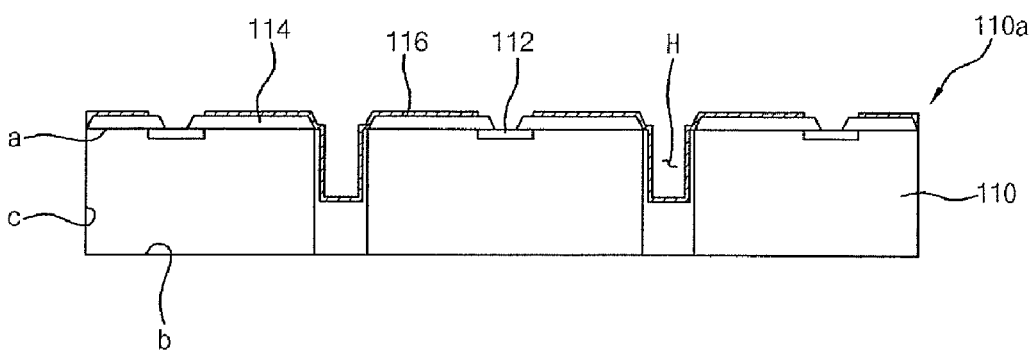

Referring to FIG. 2B, after the blind groove H is formed along the scribe lane 122, a metal seed layer 116 is then formed onto an upper face of the insulation layer 114 and onto an inner surface of the wafer 110a formed by the blind groove H. The metal seed layer 116 may be formed, for example, by using a Chemical Vapor Deposition (CVD) process or a Physical Vapor Deposition (PVD) process.

A photoresist pattern (not shown) having a plurality of openings (not shown) is formed over the metal seed layer 116. The openings of the photoresist pattern expose the bonding pads 112 and vicinities near the bonding pads 112. Subsequently, the metal seed layer 116 is patterned using the photoresist pattern as an etching mask by selectively removing the metal seed layer 116 exposed by the openings of the photoresist pattern from the insulation layer 114 and from the bonding pads 112. As a result the bonding pads 112 are electrically insulated away from the metal seed layer 116.

Figure 2C:
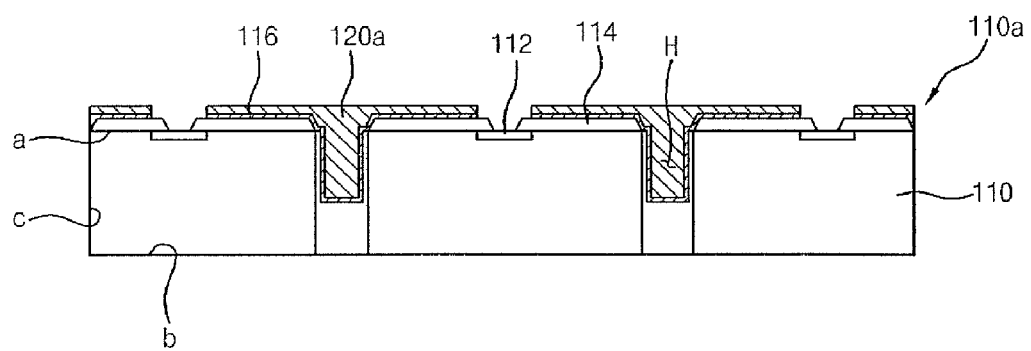

Referring to FIG. 2C, after the metal seed layer 116 is patterned, the photoresist pattern (not shown) is then removed from the metal seed layer 116 and a preliminary metal plate 120a that covers the blind groove H and the upper face 110a of the semiconductor chip 110 is formed over the metal seed layer 116. The preliminary metal plate 120a may be formed, for example, by electrolytic plating process.

The preliminary metal plate 120a may include copper or copper alloy containing copper. The preliminary metal plate 120a serves as a heat radiating plate for quickly radiating heat generated away from the semiconductor chip 110 to the outside or serves as an electromagnetic wave shielding plate for shielding electromagnetic radiation generated from the semiconductor chip 110. The preliminary metal plate 120a is electrically insulated from the bonding pads 112.

Figure 2D:
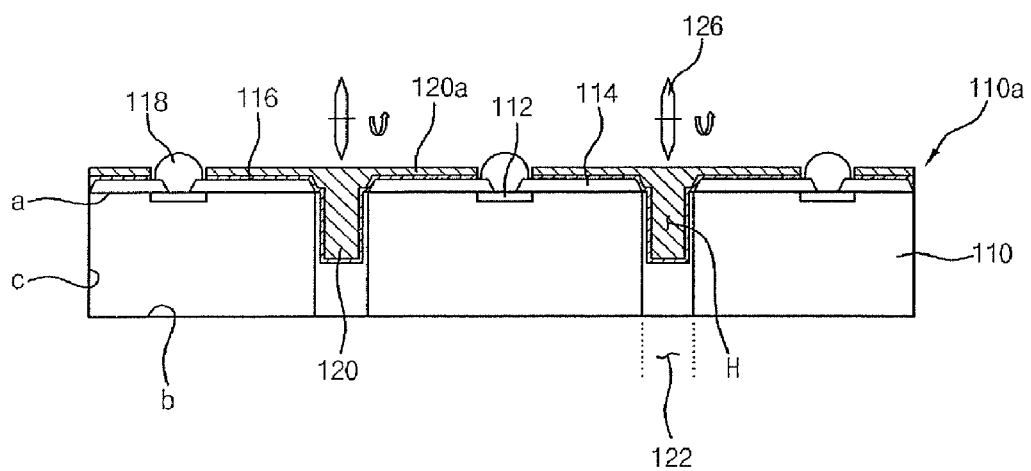

Referring to FIG. 2D, after the preliminary metal plate 120a is formed, for example, the external connection terminal 118 including a solder are electrically connected to each bonding pad 112. In the present embodiment, the external connection terminal 118 may be attached to each bonding pad 112 of separated semiconductor chips 110 after separating the semiconductor chips 110 from the wafer 110a.

After the preliminary metal plate 120a is formed, the preliminary metal plate 120a corresponding to the scribe lane 122 is cut by a second sawing process to singulate the semiconductor chips 110 of the wafer 110a.

The second sawing process is carried out by a second blade 126 and the second blade 126 has a width preferably narrower than the width of the first blade 124 used in the first sawing process. That is to say, the second blade 126 has a width less than the width of the scribe lane 122.

Figure 2E:
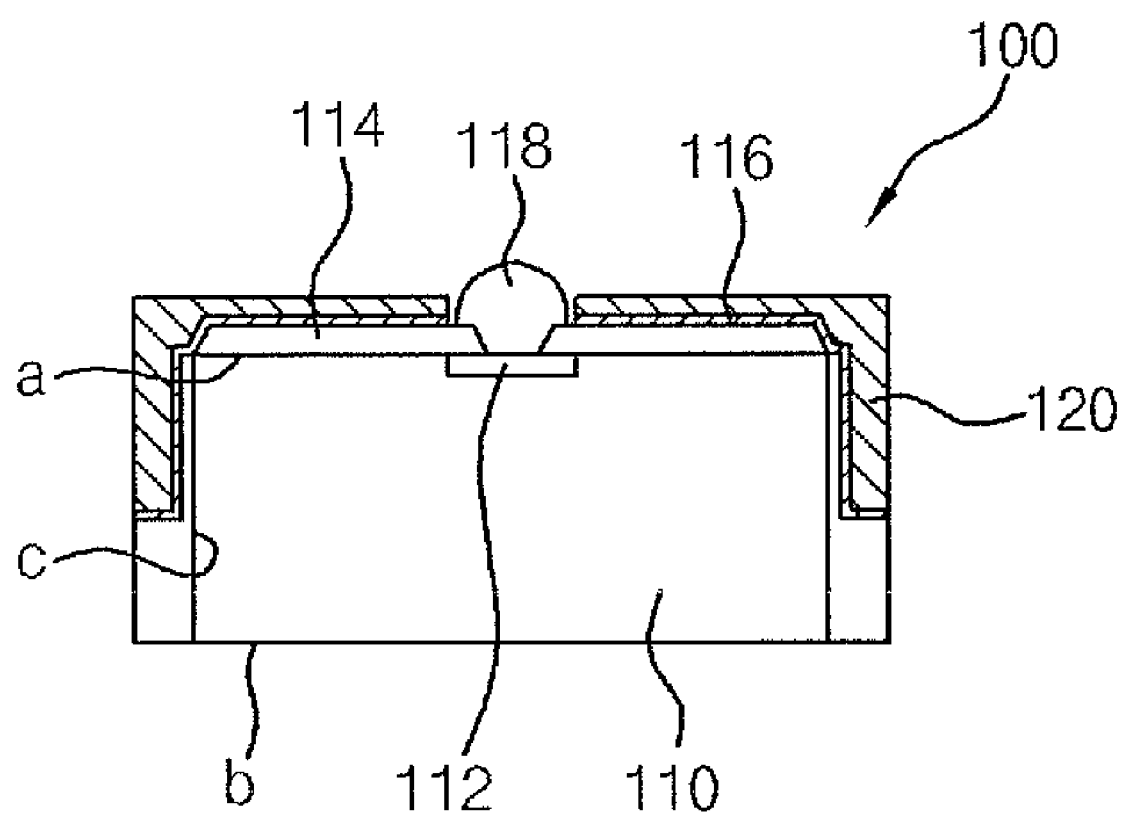

Referring to FIG. 2E, the metal plate 120 that covers the upper a face and the side c faces of the each semiconductor chip 110 is formed by cutting the preliminary metal plate 120a corresponding to the scribe lane 122 and the rest of the scribe lane 122 through the second sawing process.

In the present embodiment, since the metal plate 120 is formed integrally over the upper a face of the semiconductor chip 110 and the side c faces of the semiconductor chip 110 connected with the upper a face, it is possible to enhance the heat radiating efficiency of the wafer level chip scale package while also providing a means for shielding electromagnetic (EMF) radiation generated from the semiconductor chip 110 or EMF radiation applied from the outside to the semiconductor chip 110.

In the wafer level package in accordance with the present invention, the metal plate may be electrically connected to the external connection terminal formed over a bonding pad for grounding in order to guide the electromagnetic wave to the outside through the external connection terminal.

Figure 3A:
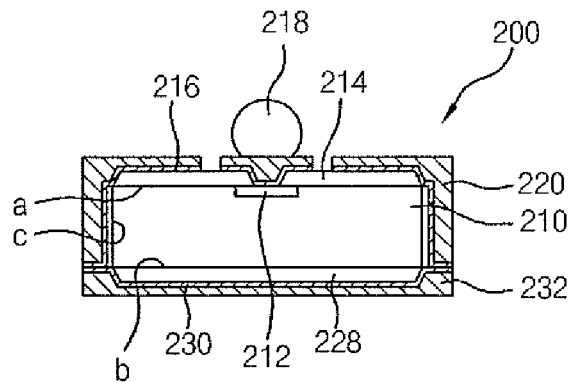
FIGS. 3A and 3B are views illustrating a wafer level chip scale package in accordance with another embodiment of the present invention.
Figure 3B:
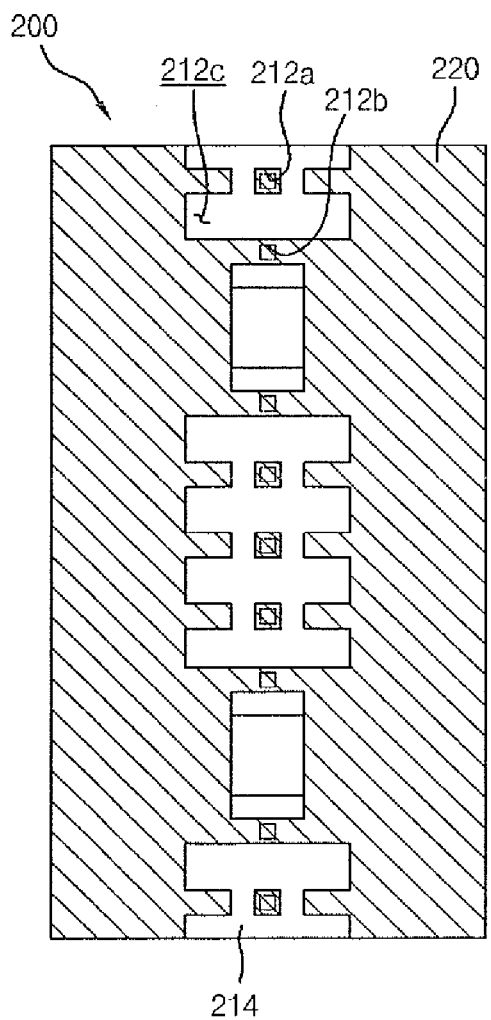

FIGS. 3A and 3B are views illustrating a wafer level chip scale package in accordance with another embodiment of the present invention.

Referring to FIGS. 3A and 3B, a semiconductor chip 210 has, for example, a rectangular parallelepiped shape, and shows a ground bonding pad 212b and a signal bonding pad 212a disposed over the upper a face of the semiconductor chip 210. In the present embodiment, the ground bonding pad 212b and the signal bonding pad 212a are arranged in a row along a middle of the upper a face of the semiconductor chip 210. In the present embodiment, the ground bonding pad 212b is grounded and the signal bonding pad 212a is electrically connected with a circuit unit of the semiconductor chip 210.

A first insulation layer 214 is disposed over the upper a face of the semiconductor chip 210. The first insulation layer 214 has an opening that exposes the signal bonding pad 212a and the ground bonding pad 212b.

The first metal plate 220 covers the upper a face of the semiconductor chip 210 and the side c faces of the semiconductor chip 110 connected with the upper a face. In the present embodiment, the first metal plate 220 covers the upper a face and side c faces of the semiconductor chip 210. The first metal plate 220 is electrically connected with the ground bonding pad 212b and is electrically insulated away from the signal bonding pad 212a. In order to insulate the signal bonding pad 212a and the first metal plate 220, an opening 212c that exposes the signal bonding pad 212a is formed in the first metal plate 220 corresponding to the signal bonding pad 212a. In the present embodiment, a first metal seed layer 216 is interposed between the first metal plate 220 and the first insulation layer 214 and the side b faces of the semiconductor chip 210.

A second insulation layer 228 is disposed under the lower b face of the semiconductor chip 210. A second metal plate 232 is disposed over the second insulation layer 228. The second metal plate 232 is connected with the first metal plate 220 disposed over the side c faces of the semiconductor chip 210. In the present embodiment, a second metal seed layer 230 is preferably interposed between the second metal plate 232 and the second insulation layer 228. The second metal seed layer 230 covers an end portion of the first metal plate disposed at the lower b face of the semiconductor chip 210.

An external connection terminal 218 that includes a solder is electrically connected to the signal bonding pad 212a. Meanwhile, the ground bonding pad 212b is electrically connected with the first and second metal plates 220, 232 formed over the upper a face, the side c faces and the lower b face of the semiconductor chip 210, and any extraneous electromagnetic wave generated from the semiconductor chip 210 through the external connection terminal 218 is therefore grounded the first and second metal plates 220, 232.

The first and second metal plates 220, 232 may include copper (Cu) or copper alloy.

FIGS. 4A through 4H are cross-sectional views illustrating the steps of a method for fabricating the wafer level chip scale package shown in FIG. 3A.

Figure 4A:
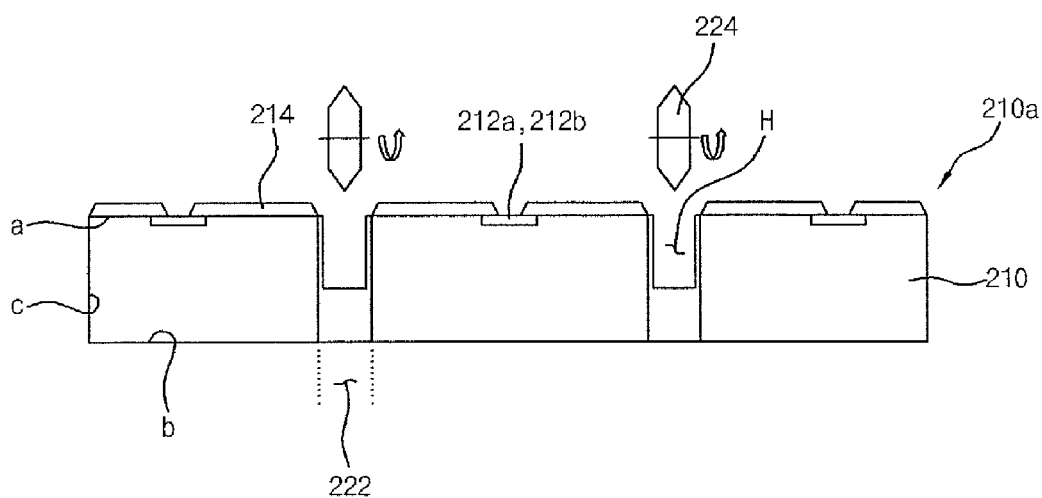
FIGS. 4A through 4J are cross-sectional views illustrating the steps of a method for fabricating the wafer level chip scale package shown in FIG. 3A.

Referring to FIG. 4A, a first sawing process is carried along a scribe lane 222 of the wafer 210a including semiconductor chips 210 having the ground bonding pad 212a, the signal bonding pad 212b and the first insulation layer 214 having the opening that exposes the ground bonding pad 212a and the signal bonding pad 212b.

The first sawing process is carried out by using a first blade 124 and forms a blind groove H having a depth shallower than a thickness of the wafer 210a.

Figure 4B:
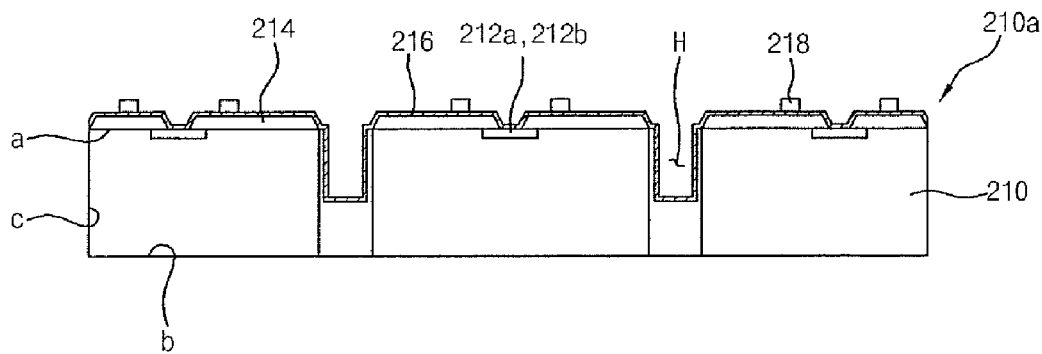

Referring to FIG. 4B, the first metal seed layer 216 is next formed that covers the inner surface of the wafer 210a formed by the first blade 224 and covers the upper a face of the semiconductor chip 210. The first metal seed layer 216 is formed, for example, by using either a CVD or a PVD process.

After the first metal seed layer 216 is formed over the wafer 210a, a mask pattern 218 is next formed that exposes the signal bonding pad 212a and the ground bonding pad 212b and covers the vicinity of the signal bonding pad 212a. The mask pattern 218 is formed, for example, in a shape of a closed loop.

Figure 4C:
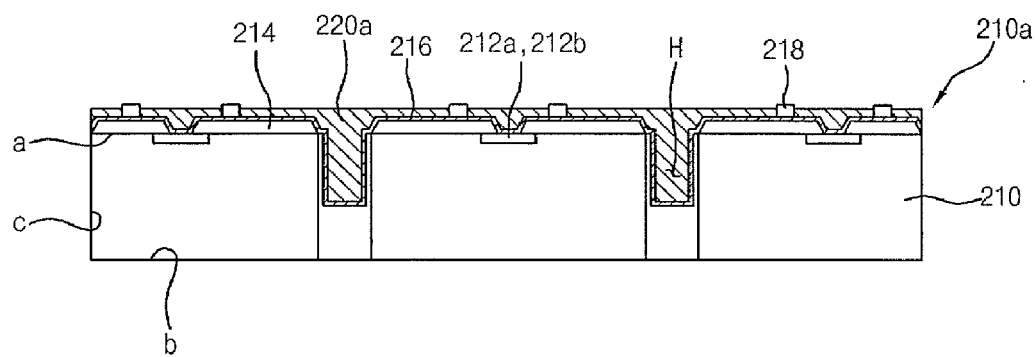

Referring to FIG. 4c, a preliminary first metal plate 220a is then formed over the first metal seed layer 216 exposed by the mask pattern 218 by using, for example, a plating process. The preliminary first metal plate 220a fills the blind groove H formed in the scribe lane 222 and is also formed over the upper a face of the semiconductor chip 210. The preliminary first metal plate 220a may include copper or a copper alloy. The preliminary first metal plate 220a serves to radiate heat generated from the semiconductor chip 110 and serves as an electromagnetic wave shielding plate for shielding most, if not all, of the EMF waves generated from the semiconductor chip 110.

Figure 4D:
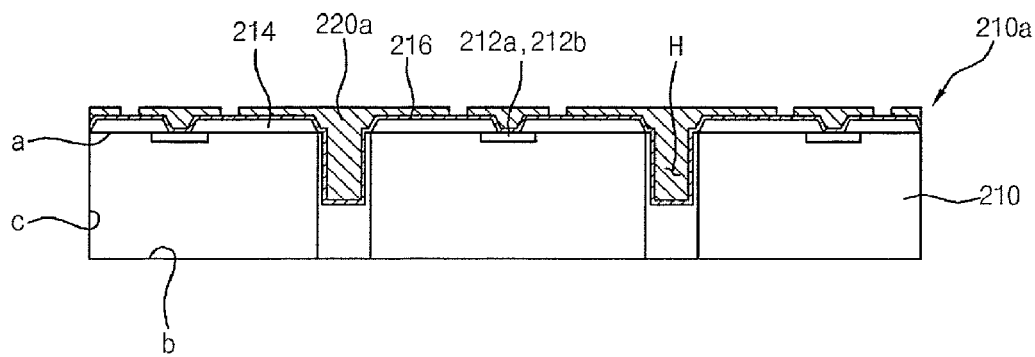
Figure 4E:
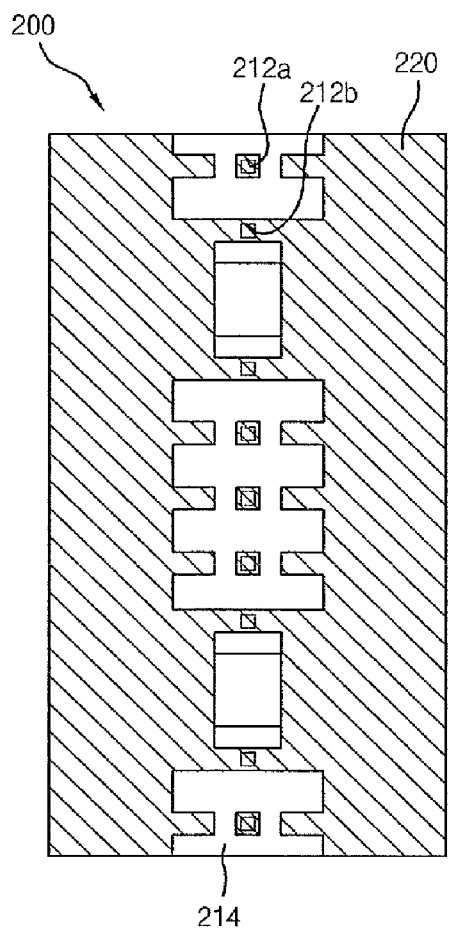

Referring to FIGS. 4D and 4E, after the preliminary first metal plate 220a is disposed over the first metal seed layer 216, the mask pattern is then removed from the first metal seed layer 216 and the exposed first metal seed layer 216 disposed at a position corresponding to the mask pattern 218 is removed from the first insulation layer 214 by using the first preliminary first metal plate 220a as an etching mask.

In the present embodiment, the ground bonding pad 212b is electrically connected with the preliminary first metal layer 220a and the signal bonding pad 212a is insulated from the preliminary first metal layer 220a.

Figure 4F:
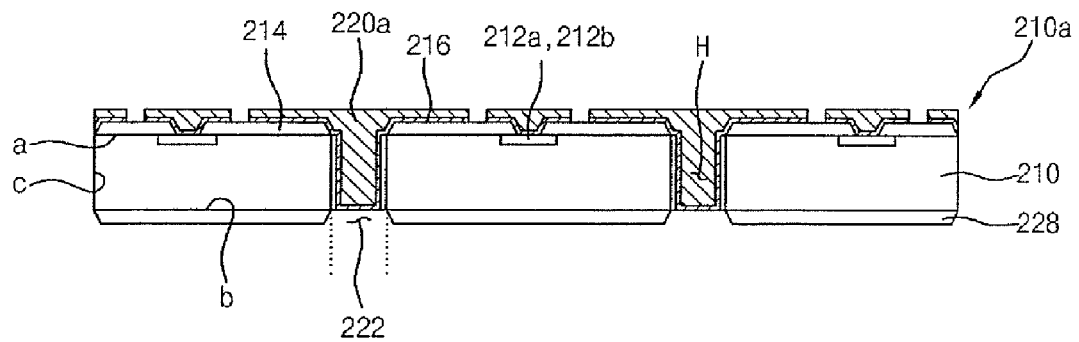

Referring to FIG. 4F, a rear face of the wafer 210a is polished by using a back grinding process to expose the first metal seed layer 216 formed in a bottom portion of the blind groove H.

Subsequently, the second insulation layer 228 is formed over the polished rear face of the wafer 210a. The second insulation layer 228 has an opening that exposes the scribe lane 222.

Figure 4G:
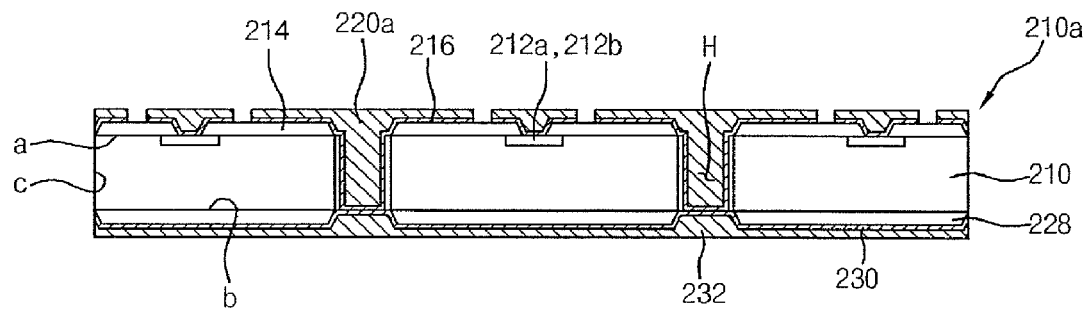

Referring to FIG. 4G, the second metal seed layer 230 is formed under the lower face of the wafer 210a to cover the first metal seed layer 216 and the second insulation layer 228.

Figure 4H:
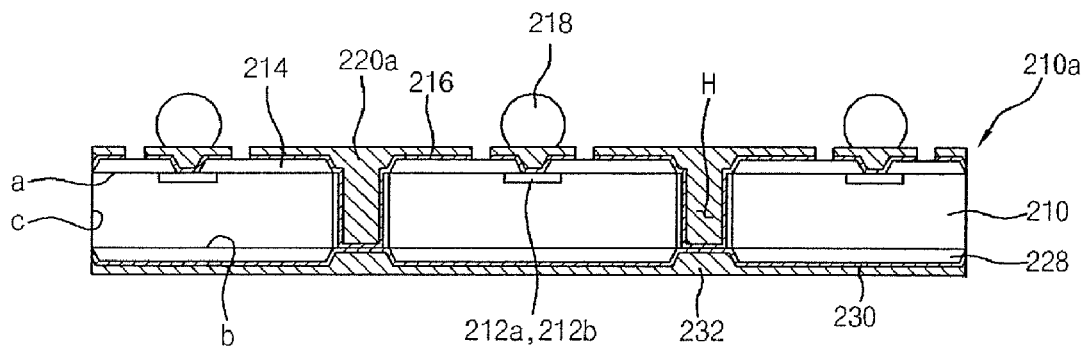

Subsequently, the second metal plate containing copper (Cu) or copper alloy is formed over the second metal seed layer 230 by using a plating process such as an electrolytic plating process. The second metal plate 232 serves to radiate heat generated from the semiconductor chip 210 and as an EMF wave shielding layer for shielding electromagnetic wave generated from the semiconductor chip 210. Referring to FIG. 4H, the external connection terminal 218 made of a solder ball is formed over the first metal plate 210 that covers an upper portion of the signal bonding pad 212a formed at each semiconductor chip 210.

Figure 4I:
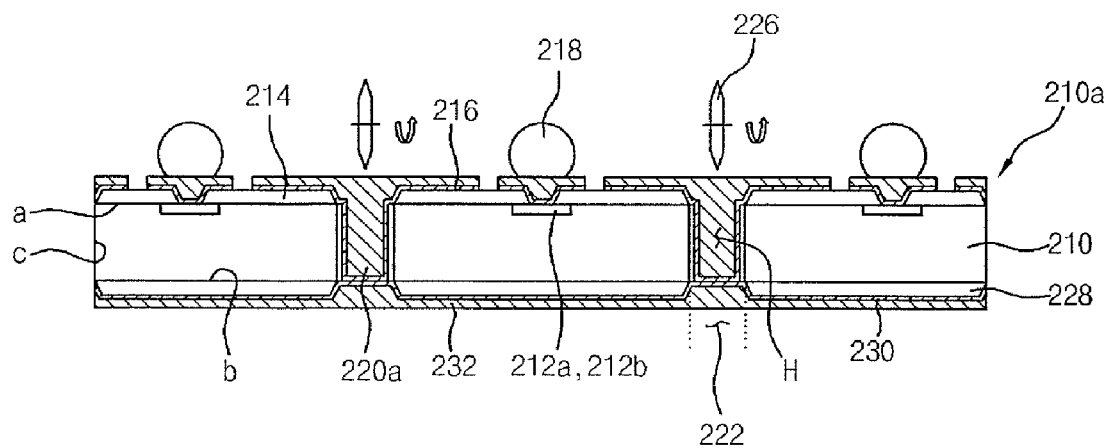
Figure 4J:
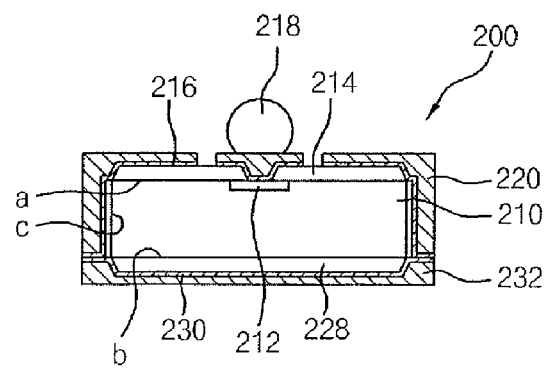

Referring to FIGS. 4I and 4J, in order to cut the wafer 210a into a plurality of wafer level chip scale packages 200 a second sawing process is implemented along the blind groove H of the wafer 210a a second sawing process is carried out using a second blade 226. As a result of implementing the second sawing process, the wafer 210a is separated into a plurality of wafer level chip scale packages 200.

In the second sawing process, it is preferable to use a blade having a thickness thinner than the thickness of the blade used in the first sawing process. This is because the first sawing process is carried out to form the groove using the blade having the thickness corresponding to the width of the scribe lane for forming the metal plate, whereas the second sawing process is carried out only to separate the remaining first metal plate at side faces of the wafer level chip scale package.

As is apparent from the above description, in the present invention, upon the fabrication process of a wafer level chip scale package, the metal plate is formed at the upper face and the side faces, or the upper face, the side faces and the lower face which is not in a standardized shape but rather in a shape capable of being in close contact with the external structure of the wafer level chip scale package.

Therefore, it is possible to maximize heat radiating efficiency of the wafer level chip scale package and to restrict the electromagnetic wave emission by not forming the metal plate used as a heat radiating plate and a shielding layer in a shape standardized to a conventional semiconductor package and a memory module using the semiconductor package but rather forming the metal plate in a shape corresponding to the structure of the wafer level chip scale package.

Also, it is possible to address the problem associated with operation properties of the semiconductor chip and the deterioration of electrical properties of other electric components resulted from extraneous electromagnetic interference by improving the electromagnetic interference by forming the ground bonding pad provided in the semiconductor chip so as to be connected with the metal plate which discharges the extrinsic electromagnetic wave of the semiconductor chip to the outside through the external connection terminal formed over the upper portion of the ground bonding pad.

Figure 5:
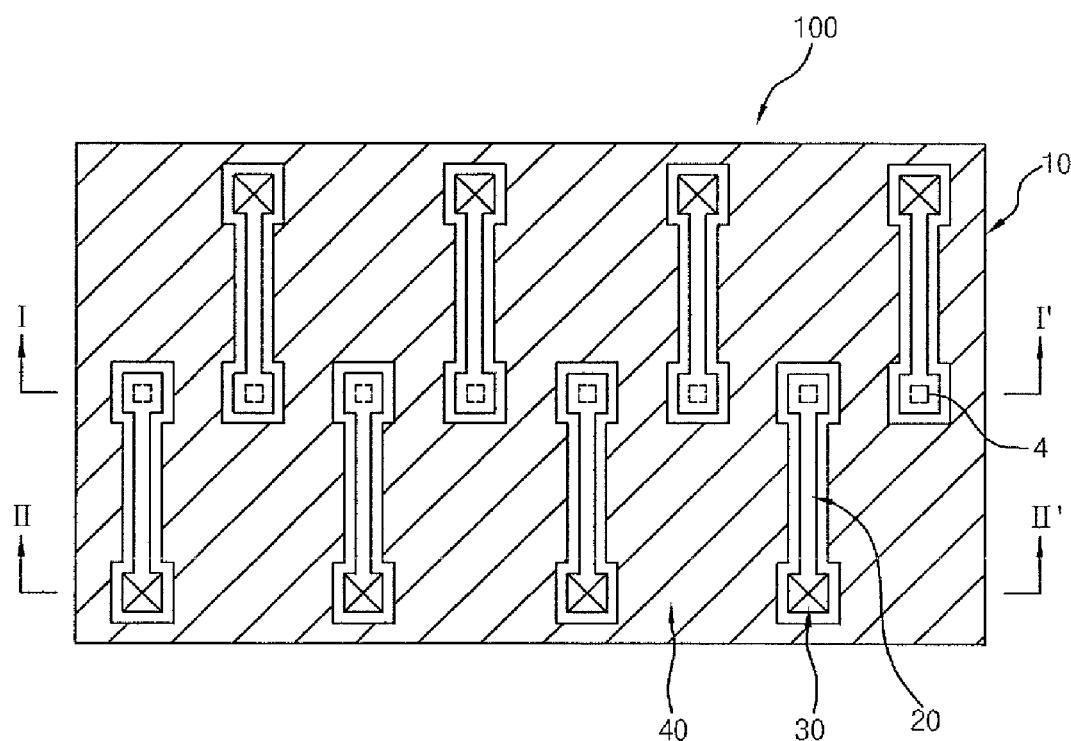
FIG. 5 is a cross-sectional view illustrating a wafer level chip scale package in accordance with further another embodiment of the present invention.
Figure 6:
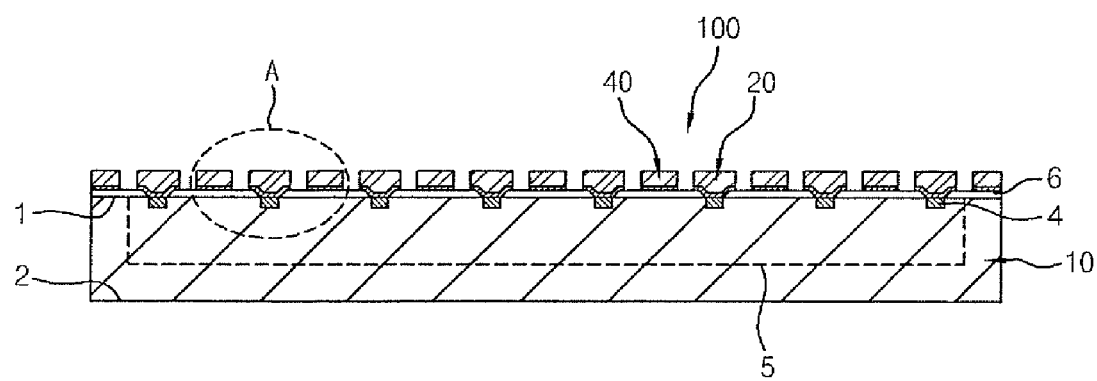
FIG. 6 is a longitudinal-sectional view taken along a line I-I' in FIG. 5.
Figure 7:
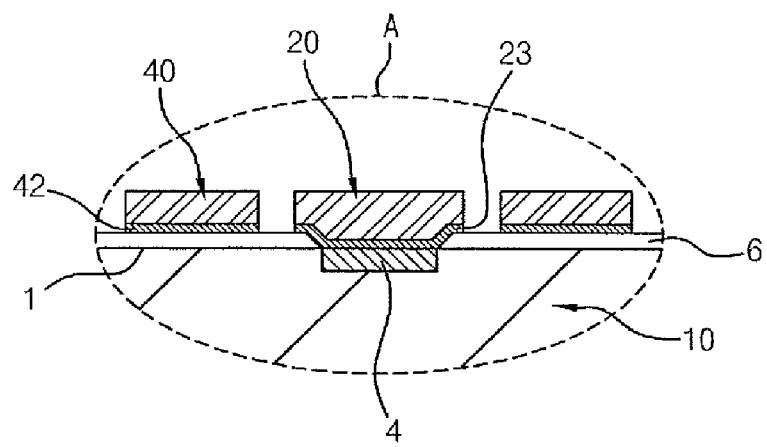
FIG. 7 is an enlarged view of a portion 'A' in FIG. 6.
Figure 8:
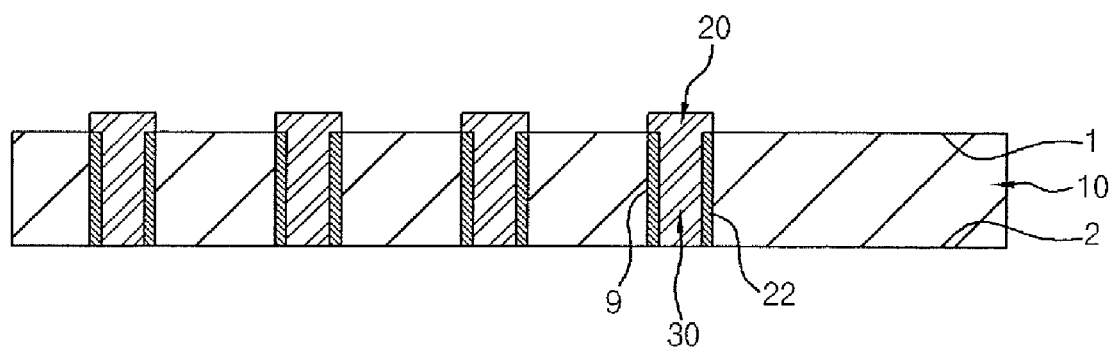
FIG. 8 is a longitudinal-sectional view taken along a line II-II' in FIG. 5.

FIG. 5 is a cross-sectional view illustrating a wafer level chip scale package in accordance with yet another embodiment of the present invention. FIG. 6 is a longitudinal-sectional view taken along a line I-I' in FIG. 5. FIG. 7 is an enlarged view of a portion 'A' in FIG. 6. FIG. 8 is a longitudinal-sectional view taken along a line II-II' in FIG. 5.

Referring to FIGS. 5 through 8, a wafer level semiconductor package 100 includes a semiconductor chip 10, redistribution units 20, through electrodes 30 and a dummy conductive pattern 40.

The semiconductor chip 10 has, for example, may have a rectangular parallelepiped shape. The semiconductor chip 10 having a rectangular parallelepiped shape has an upper face 1 and a lower face that is opposite to the upper face 1. The semiconductor chip 10 also has a passivation layer pattern 6 which is disposed over the upper face 1 of the semiconductor chip 10. The passivation layer pattern 6 has an opening that exposes each bonding pad 4 formed over the upper face 1 of the semiconductor chip 10.

The semiconductor chip 10 includes a circuit unit 5 and bonding pads 4.

The circuit unit 5 includes a data storage unit (not shown) for storing data and a data processing unit (not shown) for processing the data.

The bonding pads 4 may be arranged in a row, for example, at a middle of the upper face 1 of the semiconductor chip 10. Each bonding pads 4 is electrically connected with the circuit unit 5.

Through electrodes 30 are arranged along an edge of the semiconductor chip 10. In the present embodiment, each through electrode 30 is disposed, for example, at a position corresponding to each bonding pad 4.

The through electrode 30 is disposed in an inside of a through hole 9 that passes through the upper face 1 and the lower face 2 of the semiconductor chip 10. The through electrode 30 may include, for example, copper which has superior conductive properties and superior plating properties.

A metal seed pattern 22 may be disposed over a surface of the through electrode 30 in order to form the through electrode by plating process. Examples for the metal seed pattern 22 may include titanium, nickel, vanadium and copper.

The redistributions 20 are formed over the upper face 1 of the semiconductor chip 10. The redistribution units 20 electrically connect the bonding pads 4 and the through electrodes 30 corresponding to the bonding pad, respectively.

Each redistribution unit 20 has, when viewed from the above, preferably a bar shape. A first end portion of the redistribution unit 20 is electrically connected with the bonding pad 4 and a second end portion of the redistribution unit 20 is electrically connected with the through electrode 30 corresponding to the redistribution unit 20. In the present embodiment, the through electrode 30 and the redistribution unit 20 are formed integrally with each other.

The redistribution unit 20 may further include a metal seed pattern 23 and the metal seed pattern 23 is interposed between the retribution 20 and the upper face 1 of the semiconductor chip 10. The metal seed pattern 23 has, when viewed from the above, preferably the same shape and size as the redistribution unit 20.

In the present embodiment, the metal seed pattern 23 interposed between the redistribution unit 20 and the upper face 1 of the semiconductor chip 1 is formed integrally with the metal seed pattern 22 formed over the surface of the through electrode 30.

The dummy conductive pattern 40 is formed over the upper face 1 of the semiconductor chip 10. The dummy conductive pattern 40 is electrically insulated with the redistribution unit 20 formed over the upper face 1 of the semiconductor chip 10. The dummy conductive pattern 40 has substantially the same thickness as the redistribution unit 20. Also, the dummy conductive pattern also contains substantially the same material as the redistribution, for example, copper.

Meanwhile, the dummy conductive pattern 40 includes a dummy metal seed pattern 42 interposed between the upper face 1 of the semiconductor chip 1 and the dummy conductive pattern 40. The dummy metal seed pattern 42 has, when viewed from the above, substantially the same shape and size as the dummy conductive pattern 40. The dummy metal seed pattern 42 may include substantially the same material as the aforementioned metal seed pattern 22, 23.

In the present embodiment, when forming the dummy conductive pattern 40 and redistribution 20 disposed over the upper face 1 of the semiconductor chip 10 by, for example, plating method, an entire area of the dummy conductive pattern 40 has an influence on thicknesses of the dummy conductive pattern 40 and the redistribution unit 20.

For example, when the area of the dummy conductive pattern 40 is increased, an amount of current applied to the dummy conductive pattern 40 and the redistribution unit 20 during the plating process is decreased to prevent excessive increase in the thicknesses of the resultant dummy conductive pattern 40 and the resultant redistribution unit 20.

For example, when the area of the dummy conductive pattern 40 is decreased, an amount of current applied to the dummy conductive pattern 40 and the redistribution unit 20 during the plating process is increased to increase the thicknesses of the dummy conductive pattern 40 and the redistribution unit 20.

Therefore, by controlling the area of the dummy conductive pattern 40, it is possible to control the thicknesses of the dummy conductive pattern 40 and the redistribution unit 20 to the thickness desired by the user.

In accordance with the above description, when forming together the through electrode passing through the semiconductor chip and the redistribution unit formed integrally with the through electrode, it is possible to prevent the excessive increase in the thickness of the redistribution unit and resultant reduction in the electrical properties of the redistribution unit by forming together the dummy conductive pattern that controls the thickness of the redistribution unit during the plating process over the same plane as the redistribution unit.

FIGS. 9 through 16 are plan view, longitudinal-sectional views and an enlarged view illustrating the steps of a method for fabricating a semiconductor package in accordance with an embodiment of the present invention.

Figure 9:
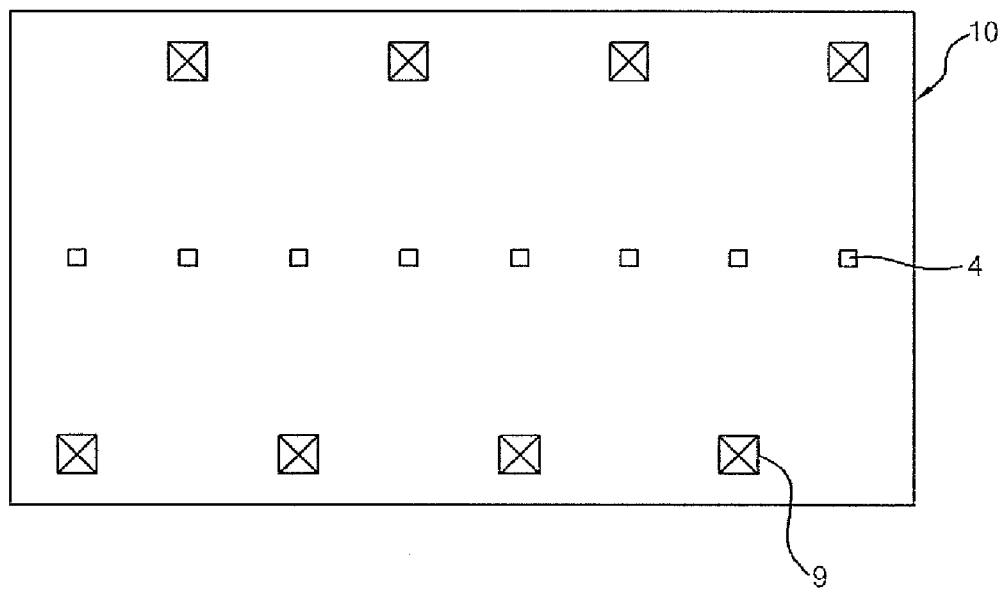
FIGS. 9 through 16 are plan view, longitudinal-sectional views and an enlarged view illustrating the steps of a method for fabricating a semiconductor package in accordance with an embodiment of the present invention.

FIG. 9 is a plan view illustrating the through holes formed in the semiconductor chip in accordance with a method for fabricating the semiconductor package of the present invention.

Referring to FIG. 9, in order to fabricate the semiconductor package, the through holes 9 that pass through the upper face and the lower face opposite to the upper face of the semiconductor chip 10 are formed along with the bonding pads 4 arranged along the middle of the upper face of the semiconductor chip 10. In the present embodiment, the through holes 9 respectively corresponding to the bonding pads 4 are formed, for example, along the edge of the semiconductor chip 10.

In the present embodiment, the through hole 9 may be formed by any number of techniques such as a laser drilling process, a drilling process and an etching process.

Figure 10:
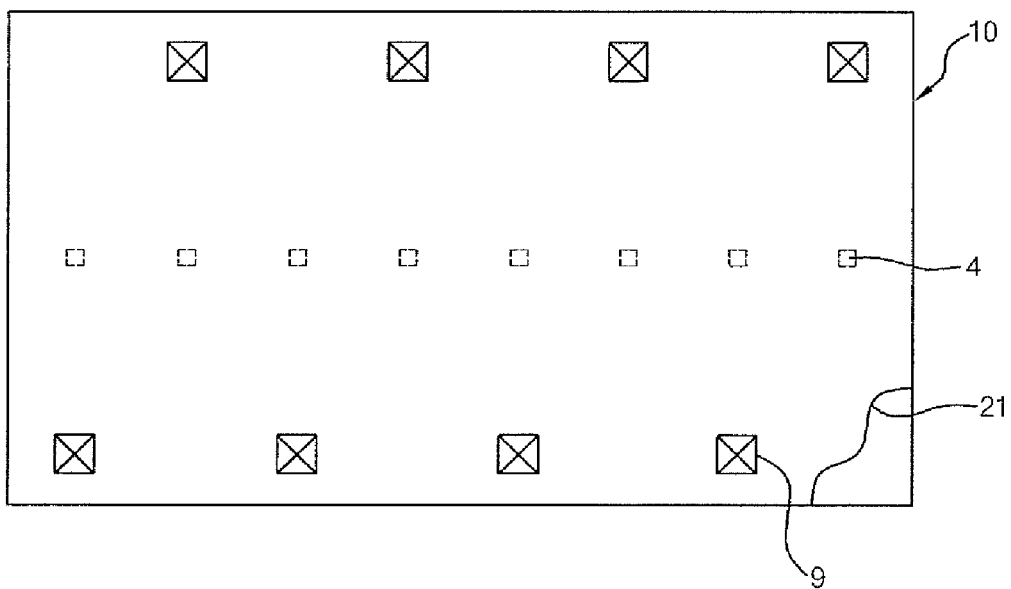

FIG. 10 is a plan view illustrating that the metal seed layer is formed over the upper face of the semiconductor chip shown in FIG. 9.

Referring to FIG. 10, after the through holes 9 passing through the upper face and the lower face of the semiconductor chip 10 are formed, a metal seed layer 21 is formed over the inner surfaces formed by the through holes 9 formed in the semiconductor chip 10 and over the upper face of the semiconductor chip 10.

In the present embodiment, the metal seed layer 21 may be formed by a PVD process such as plating process or sputtering process. Examples for the metal seed layer 21 include materials selected from titanium, nickel, vanadium and copper.

Figure 11:
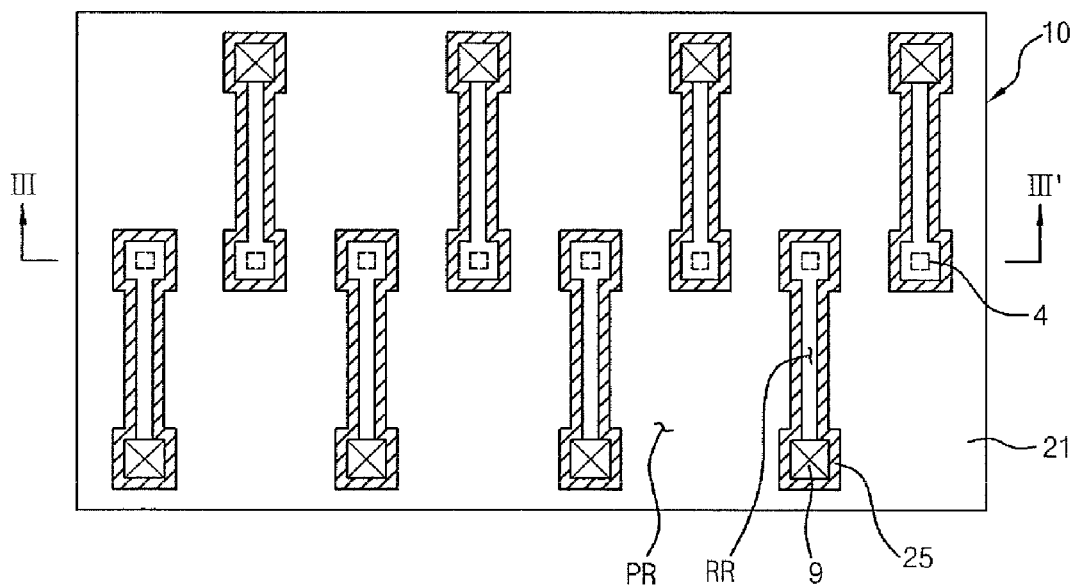
Figure 12:
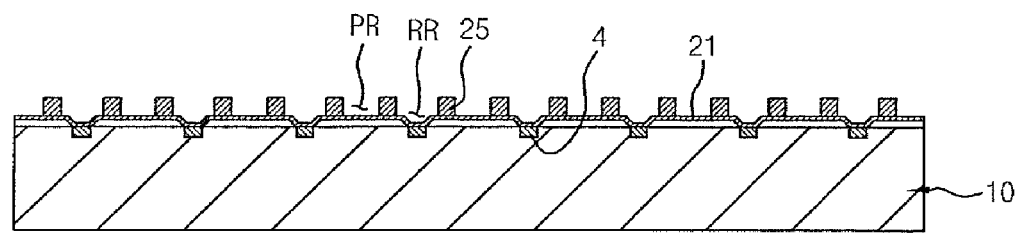

FIG. 11 is a plan view illustrating a mask formed over the metal seed layer shown in FIG. 10. FIG. 12 is a longitudinal-sectional view taken along a line III-III' in FIG. 11.

Referring to FIGS. 11 and 12, after the metal seed layer 21 is formed over the upper face of the semiconductor chip 10, a mask pattern 25 is formed over the metal seed layer 21.

The mask pattern 25 may be formed, for example, by forming a photoresist film including photosensitive material over the metal seed layer 21 using a spin coating manner and patterning the photoresist film by using a photo process including exposure process and development processes. Alternatively, the mask pattern 25 may be formed by providing flowable mask material onto the metal seed layer 21 through a dispenser.

In the present embodiment, the mask pattern 25 has, for example, preferably a band shape, and the mask pattern 25 having the band shape connects the though holes 9 and the bonding pads 4 [9→4] respectively corresponding to the through holes 9, for example, in a shape of a closed loop.

For example, an inside of the mask pattern having a closed loop shape is defined as a redistribution region RR, and the outside of the mask pattern is defined as a peripheral region PR.

In the present embodiment, the mask pattern 25 that defines the redistribution region RR and the peripheral region PR has a large influence on the thicknesses of the redistribution and the dummy conductive pattern which will be described later.

For example, when decreasing an area of the peripheral region PR by increasing a width of the mask pattern 25, the thicknesses of the redistribution and the dummy conductive pattern respectively formed in the redistribution region RR and the peripheral region PR are increased.

On the contrary, when increasing an area of the peripheral region PR by decreasing a width of the mask pattern 25, the thicknesses of the redistribution and the dummy conductive pattern respectively formed in the redistribution region RR and the peripheral region PR are decreased.

Therefore, it is possible to control the thicknesses of the redistribution and the dummy conductive pattern which will be described later by increasing or decreasing the width of the mask pattern 25.

Figure 13:
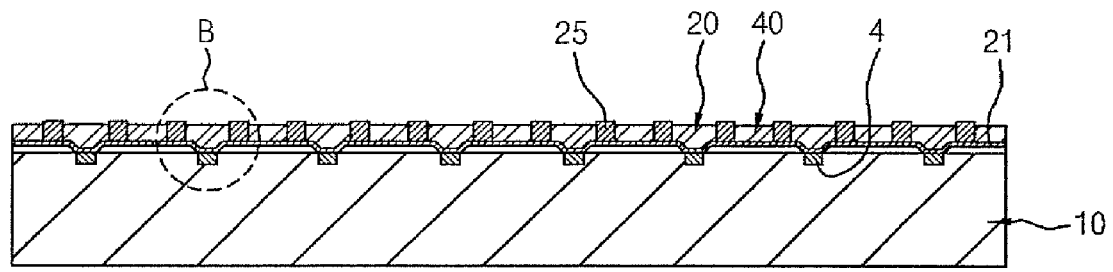
Figure 14:
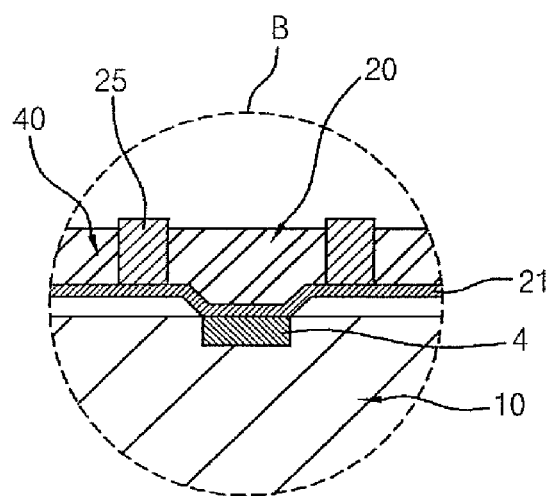

FIG. 13 is a longitudinal-sectional view illustrating that the redistribution and the dummy conductive pattern formed over the metal seed layer shown in FIG. 12. FIG. 14 is an enlarged view illustrating a portion 'B' in FIG. 13.

Referring to FIGS. 13 and 14, after the mask pattern 25 is formed over the metal seed layer 21 formed over the upper face of the semiconductor chip 10, plating process is carried out on the metal seed layer 21 using the mask pattern 25 as a plating mask. By the plating process, the through electrode is formed in the inside of the through hole, the redistribution unit 20 formed integrally with the through electrode is formed in the redistribution region RR and the dummy conductive pattern 40 is formed together in the peripheral region PR. At this time, the plating process is not carried out on the metal seed layer 21 corresponding to the mask pattern 25.

In the present embodiment, although the through electrode has a relatively high height, it is possible to accurately control the thicknesses of the dummy conductive pattern 40 and the redistribution 20 by controlling the width of the mask pattern 25 and the resultant area of the dummy conductive pattern 40 formed in the peripheral region PR and this prevents degradation in the electrical properties brought about by the excessive thickness of the redistribution unit 20.

Figure 15:
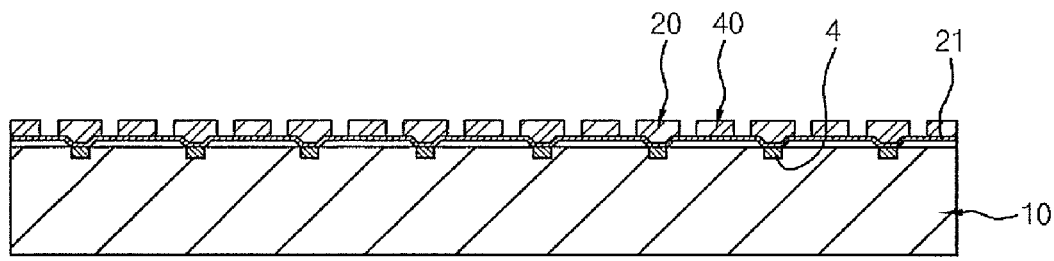

FIG. 15 is a longitudinal-sectional view illustrating that the mask pattern is removed from the metal seed layer.

Referring to FIG. 15, after forming the redistribution unit in the redistribution region RR and the dummy conductive pattern 40 in the peripheral region PR using the mask pattern 25, the mask pattern 25 is removed from the metal seed layer 21. The mask pattern 25 may be removed, for example, by ashing process using an oxygen plasma or a stripping process.

Figure 16:
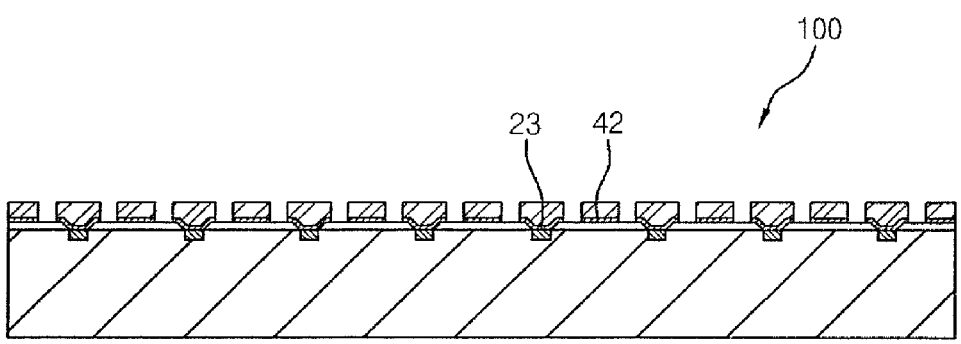

FIG. 16 is a longitudinal-sectional view illustrating that the metal seed layer shown in FIG. 15 is patterned.

Referring to FIG. 16, after removing the mask pattern 25 from the metal seed layer 21, the exposed metal seed layer 21 is then patterned using the redistribution unit 20 and the dummy conductive pattern 40 as an etching mask to form the metal seed pattern 23 in the redistribution region RR and to form the dummy metal seed pattern 42 in the peripheral region PR, thereby fabricating the semiconductor package 100.

As is apparent from the above description, it is possible to form the through electrode and the redistribution electrically connected with the through electrode by a single plating process as well as to prevent reduction in the electrical properties of the redistribution by accurate control of the thickness of the redistribution.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A wafer level chip scale package, comprising:
   a semiconductor chip having a circuit unit and bonding pads electrically connected to the circuit unit;
   through electrodes passing through an upper face of the semiconductor chip and through a lower face of the semiconductor opposite to the upper face;
   redistribution units disposed over the upper face of the semiconductor chip, each redistribution unit provided with a first end portion formed integrally with a corresponding through electrode and a second end portion opposite to the first end portion and electrically connected with the bonding pads; and
   a dummy conductive pattern disposed over the upper face of the semiconductor chip and electrically insulated away from the redistribution units.

2. The wafer level chip scale package according to claim 1, further comprising a dummy metal seed pattern interposed between the dummy conductive pattern and the upper face of the semiconductor chip.

3. The wafer level chip scale package according to claim 1, wherein the redistribution units and the dummy conductive pattern have substantially the same thickness.

* * * * *